(12) United States Patent
Park et al.

(10) Patent No.: US 11,270,913 B2
(45) Date of Patent: Mar. 8, 2022

(54) BEOL METALLIZATION FORMATION

(71) Applicant: INTERNATIONAL BUSINESS MACHINES CORPORATION, Armonk, NY (US)

(72) Inventors: Chanro Park, Clifton Park, NY (US); Kenneth Chun Kuen Cheng, Albany, NY (US); Koichi Motoyama, Clifton Park, NY (US); Brent Anderson, Jericho, VT (US); Somnath Ghosh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/860,124

(22) Filed: Apr. 28, 2020

(65) Prior Publication Data
US 2021/0335666 A1   Oct. 28, 2021

(51) Int. Cl.
*H01L 21/768* (2006.01)
*H01L 21/3213* (2006.01)
*H01L 23/522* (2006.01)
*H01L 23/532* (2006.01)

(52) U.S. Cl.
CPC .. *H01L 21/76892* (2013.01); *H01L 21/32136* (2013.01); *H01L 21/32139* (2013.01); *H01L 21/76805* (2013.01); *H01L 21/76819* (2013.01); *H01L 21/76877* (2013.01); *H01L 23/5226* (2013.01); *H01L 23/53242* (2013.01)

(58) Field of Classification Search
CPC ........... H01L 21/76838; H01L 21/7687; H01L 21/76877; H01L 21/76807; H01L 21/76808; H01L 21/768; H01L 21/76805; H01L 21/76834; H01L 21/76837; H01L 21/76829; H01L 21/76831; H01L 21/76832; H01L 21/76819; H01L 21/7684
See application file for complete search history.

(56) References Cited

U.S. PATENT DOCUMENTS

| | | | |
|---|---|---|---|
| 6,040,628 A * | 3/2000 | Chiang | ............... H01L 23/5222 257/640 |
| 6,413,852 B1 | 7/2002 | Grill et al. | |
| 8,357,609 B2 | 1/2013 | Ryan | |
| 9,613,861 B2 | 4/2017 | Anderson et al. | |
| 9,761,489 B2 | 9/2017 | Mebarki et al. | |
| 9,793,163 B2 | 10/2017 | Bristol et al. | |
| 9,859,215 B1 | 1/2018 | Edelstein et al. | |
| 10,128,185 B2 | 11/2018 | Bruce et al. | |

(Continued)

*Primary Examiner* — Thanhha S Pham
(74) *Attorney, Agent, or Firm* — Tutunjian & Bitetto, P.C.; Abdy Raissinia (57) ABSTRACT

A method is presented for back-end-of-the-line (BEOL) metallization with lines formed by subtractive patterning and vias formed by damascene processes. The method includes depositing a dielectric layer over a conductive layer formed over a substrate, forming spacers surrounding mandrel sections formed over the dielectric layer, selectively depositing gap fill material adjacent the spacers, selectively removing the spacers, etching the dielectric layer and the conductive layer to expose a top surface of the substrate, depositing and planarizing an interlayer dielectric, selectively forming openings in the dielectric layer, and filling the openings with a conductive material to define metal vias.

18 Claims, 7 Drawing Sheets

(56) References Cited

U.S. PATENT DOCUMENTS

| | | |
|---|---|---|
| 10,177,031 B2 | 1/2019 | Bao et al. |
| 2006/0121721 A1 | 6/2006 | Lee et al. |
| 2009/0166612 A1 | 7/2009 | Cain et al. |
| 2012/0187566 A1 | 7/2012 | Horak et al. |
| 2014/0284813 A1* | 9/2014 | Greco ............... H01L 21/31144 257/774 |
| 2019/0035677 A1 | 1/2019 | Chandhok et al. |

* cited by examiner

BEOL METALLIZATION FORMATION

BACKGROUND

The present invention relates generally to semiconductor devices, and more specifically, to achieving back-end-of-the-line (BEOL) metallization with lines formed by subtractive patterning and vias formed by damascene processes.

Semiconductor devices are fabricated by sequentially depositing insulating (dielectric) layers, conductive layers and semiconductor layers of material over a semiconductor substrate, and patterning the various layers using lithography to form circuit components and elements thereon. A common conductive material used in the past for conductive lines was aluminum, which can be directly etched. However, as performance demands of integrated circuits ("ICs") continued, aluminum was lacking both because its resistivity became unacceptable, and the challenge of making smaller, reliable interconnects with aluminum.

Accordingly, aluminum interconnects were replaced with the lower resistivity copper. In contrast to aluminum, copper interconnects are made by a metal polishing process (dual damascene) rather than direct etching because of copper corrosion during the etch process, and the challenge of overlay of separate via, line lithography steps. However, as dimensions continue to shrink, especially beyond 7 nm node, filling aggressive dual damascene openings and the liner occupying much of the interconnect space compels a search for alternative methods of making interconnects.

SUMMARY

In accordance with an embodiment, a method is provided for back-end-of-the-line (BEOL) metallization with lines formed by subtractive patterning and vias formed by damascene processes. The method includes depositing a dielectric layer over a conductive layer formed over a substrate, forming spacers surrounding mandrel sections formed over the dielectric layer, depositing gap fill material adjacent the spacers and planarizing, selectively removing the spacers, etching the dielectric layer and the conductive layer to expose a top surface of the substrate, depositing and planarizing an inter-layer dielectric, selectively forming openings in the dielectric layer, and filling the openings with a conductive material to define metal vias.

In accordance with another embodiment, a method is provided for back-end-of-the-line (BEOL) metallization with lines formed by subtractive patterning and vias formed by damascene processes. The method includes forming a dielectric layer over a conductive layer, etching the dielectric layer and the conductive layer to define a first metallization level, depositing an inter-layer dielectric, selectively forming openings in the dielectric layer, and filling the openings with a conductive material to define metal vias in a second metallization level.

In accordance with yet another embodiment, a semiconductor structure is provided for back-end-of-the-line (BEOL) metallization with lines formed by subtractive patterning and vias formed by damascene processes. The semiconductor structure includes a first metallization level including a plurality of conductive lines, and a second metallization level including a plurality of conductive pillars, wherein the conductive pillars are fully aligned with the conductive lines and a height of the plurality of conductive lines is predetermined.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for achieving back-end-of-the-line (BEOL) metallization with lines formed by subtractive patterning and vias formed by damascene processes. Via heights and metal lines can be predetermined.

With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the BEOL. BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step.

In order to overcome limitations of copper damascene processes, two approaches have been introduced, that is, employing single damascene copper interconnects and employing subtractive reactive ion etch (RIE) interconnect formation. However, the single damascene process presents issues in lithography for upper level metal lines, as they are sometimes misaligned with respect to the vias. Moreover, subtractive RIE processes for formation of metal lines needs alignment of metal lines to vias, which presents the same issues of misalignment as in the single damascene process.

The exemplary embodiments of the present invention alleviate such issues by allowing for a metal (e.g., Ru) and via height to be predetermined. The via is fully aligned to the underlying metal line. Further, no erosion of the via during the metal etching occurs, thus making the via height consistent with a substantially flat top surface. As a result, BEOL metallization with lines formed by subtractive patterning and vias formed by damascene processes can be achieved. In other words, BEOL metallization can be built with a combination of subtractive line etching and damascene vias.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
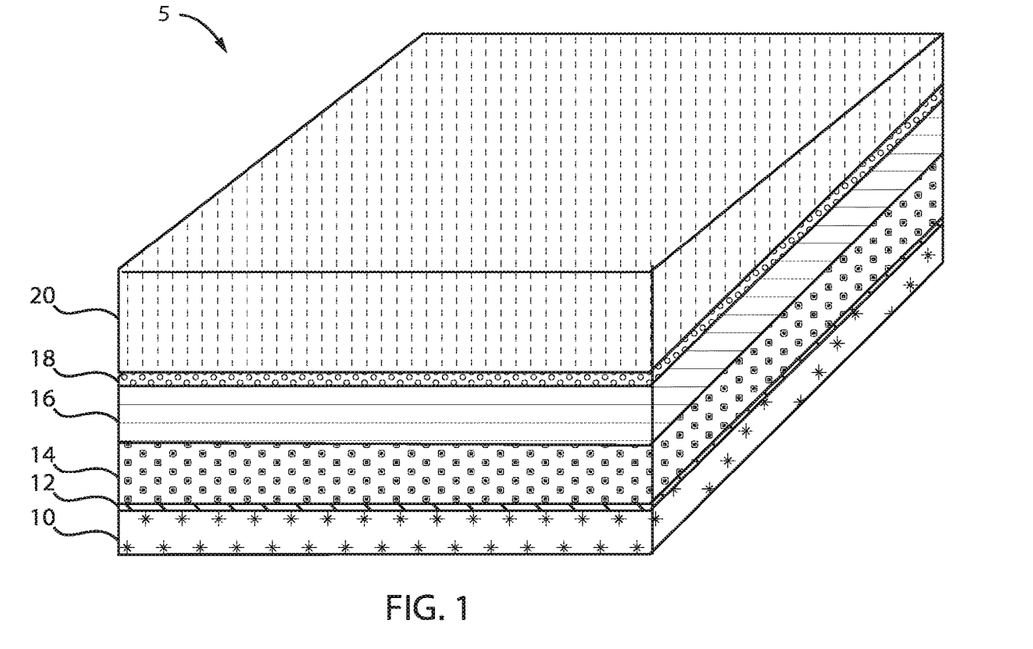
FIG. 1 is a perspective view of a semiconductor structure including a stack having a mandrel layer formed over a ruthenium (Ru) layer, in accordance with an embodiment of the present invention.

FIG. 1 is a perspective view of a semiconductor structure including a stack having a mandrel layer formed over a ruthenium (Ru) layer, in accordance with an embodiment of the present invention.

The semiconductor structure 5 includes a liner 12 formed over a substrate 10. A conductive layer 14 is formed over the liner 12. A dielectric layer 16 is formed over the conductive layer 14. A hardmask layer 18 is formed over the dielectric layer 16. A mandrel layer 20 is deposited over the hardmask layer 18.

The liner 12 can be a metal liner employed to improve adhesion between the conductive layer 14 and the substrate 10. The metal liner 12 also acts as an etch stop layer for the conductive layer 14.

The thickness of the conductive layer 14 corresponds to a metal line height.

The thickness of the dielectric layer 16 corresponds to a via height and loss during via chemical mechanical polishing (CMP).

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The conductive layer 14 can be any conductive materials known in the art, such as, for example, copper (Cu), aluminum (Al), tungsten (W), ruthenium (Ru) or cobalt (Co). The conductive layer 14 can be fabricated using any technique known in the art. In a preferred embodiment, the conductive layer 14 is ruthenium (Ru) and can include a metal liner 12, where the metal liner 12 can be metals, such as, for example, tantalum nitride and tantalum (TaN/Ta), titanium, titanium nitride, tantalum nitride, cobalt, ruthenium, and manganese or combinations thereof.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering.

Non-limiting examples of suitable dielectric layer 16 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Non-limiting examples of suitable materials for the dielectric layer 16 further include oxides, nitrides, oxynitrides, silicates (e.g., metal silicates), aluminates, titanates, nitrides, or any combination thereof.

In various embodiments, the hardmask layer 18 can be a nitride, for example, a silicon nitride (SiN), an oxynitride, for example, silicon oxynitride (SiON), or a combination thereof. In a preferred embodiment, the hardmask layer 18 can be silicon nitride (SiN), for example, $Si_3N_4$.

In one or more embodiments, the hardmask layer 18 can have a thickness in the range of about 10 nm to about 100 nm, or in the range of about 35 nm to about 75 nm, or in the range of about 45 nm to about 55 nm, although other thicknesses are contemplated.

The mandrel material 20 can be deposited, for example, by CVD or spin coating. The thickness of the mandrel material 20 can be from 30 nm to 300 nm, although lesser and greater thicknesses can also be employed.

Figure 2:
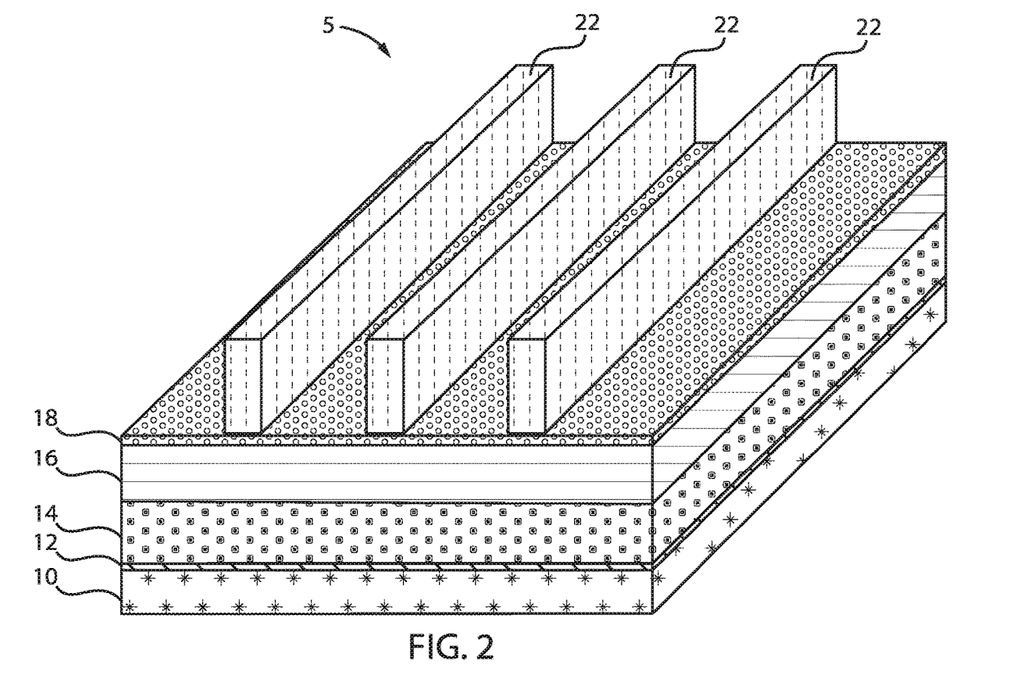
FIG. 2 is a perspective view of the semiconductor structure of FIG. 1 where the mandrel layer is patterned, in accordance with an embodiment of the present invention.

FIG. 2 is a perspective view of the semiconductor structure of FIG. 1 where the mandrel layer is patterned, in accordance with an embodiment of the present invention.

In various example embodiments, the mandrel layer 20 is patterned into mandrel portions or sections 22. In some embodiments, mandrel portions 22 are formed of amorphous silicon (a-Si) or another material that has a high etching selectivity with the underlying hardmask layer 18. For example, the mandrel portions 22 can also be SiN, SiCN, SiOCN, SiBCN, etc. The a-Si mandrel portions 22 are easy to etch and cut, exhibit suitable profile control, and acceptable selectivity to titanium nitride (TiN), meaning that there is no TiN gouging.

Figure 3:
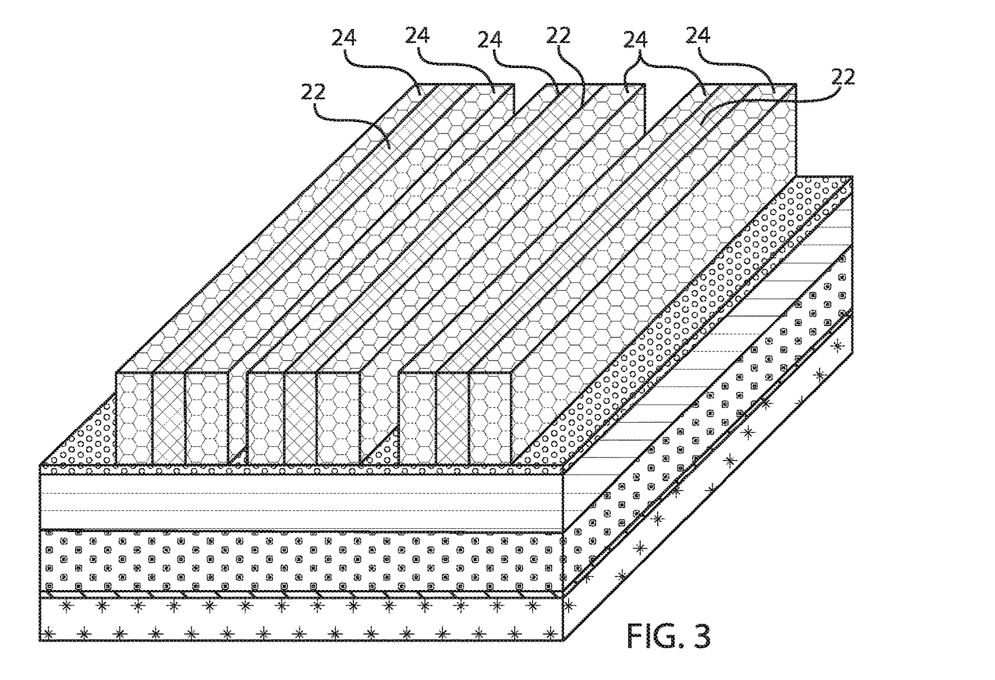
FIG. 3 is a perspective view of the semiconductor structure of FIG. 2 where spacers are deposited and etched-back to surround the patterned mandrel sections, in accordance with an embodiment of the present invention.

FIG. 3 is a perspective view of the semiconductor structure of FIG. 2 where spacers are deposited and etched-back to surround the patterned mandrel sections, in accordance with an embodiment of the present invention.

In various example embodiments, spacers 24 are deposited and etched back. The spacers 24 are deposited such that they surround the mandrel portions 22. The spacers 24 are parallel to the mandrel portions 22. The spacers 24 extend a length of the conductive layer 14.

In some embodiments, the spacers 24 can be formed using a sidewall image transfer (SIT) technique.

The material of spacers 24 is selected to have a high etching selectivity with hardmask layer 18. For example, the material of spacers 24 can be selected from AlO, AN, AlON, TaN, TiN, TiO, Si, SiO, SiN, metals, and metal alloys. The spacer material 24 is different than the material for mandrel portions 22.

In some embodiments, the mandrel portions 22 can be polysilicon, the spacers 24 can be nitride, and the hardmask layer 18 can be an oxide. In other embodiments, the hardmask layer 18 can include nitride, the mandrel portions 22 can include amorphous carbon, and the spacers 24 can include a metal, such as titanium nitride (TiN), or oxide.

Figure 4:
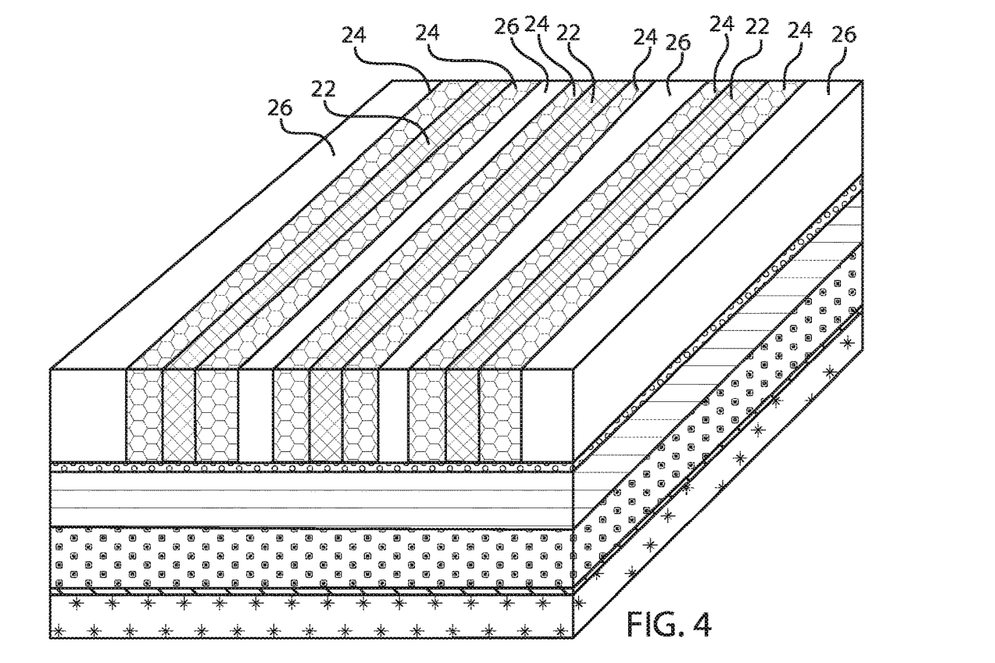
FIG. 4 is a perspective view of the semiconductor structure of FIG. 3 where a gap fill material is deposited, in accordance with an embodiment of the present invention.

FIG. 4 is a perspective view of the semiconductor structure of FIG. 3 where a gap fill material is deposited, in accordance with an embodiment of the present invention.

In various example embodiments, a gap fill material 26 is deposited and etched back or polished. The gap fill material can be, e.g., an organic planarization layer (OPL). In other embodiments, the gap fill material can be spin-on-glass, spin-on-carbon, spin-on-silicon carbide, conformal oxide films, etc.

The gap fill material 26 can be employed as a lithographic stack to pattern the underlying layers. The gap fill material 26 is formed at a predetermined thickness to provide reflectivity and topography control during etching of the hard mask layers below. The gap fill material 26 can include an organic material, such as a polymer. The thickness of the gap fill material 26 can be in a range from about 10 nm to about 300 nm. In one example, the thickness of the gap fill material 26 is about 30 nm-50 nm.

Figure 5:
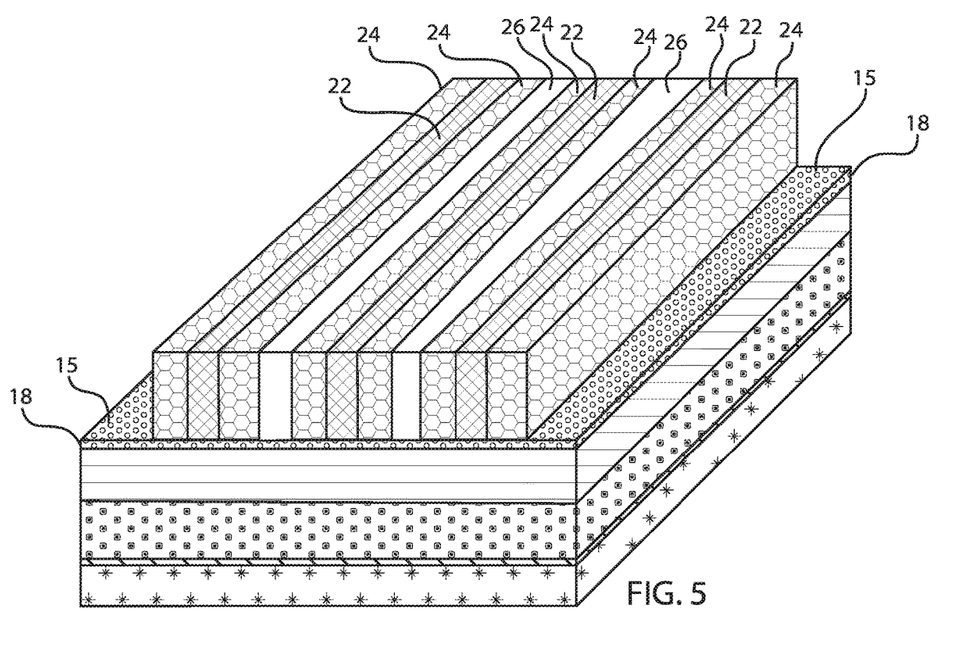
FIG. 5 is a perspective view of the semiconductor structure of FIG. 4 where certain gap fill sections are selectively removed, in accordance with an embodiment of the present invention.

FIG. 5 is a perspective view of the semiconductor structure of FIG. 4 where certain gap fill sections are selectively removed, in accordance with an embodiment of the present invention.

In various example embodiments, gap fill material at the edges is removed. The removal of select gap fill material sections results in exposure of a top surface 15 of the hardmask layer 18.

Figure 6:
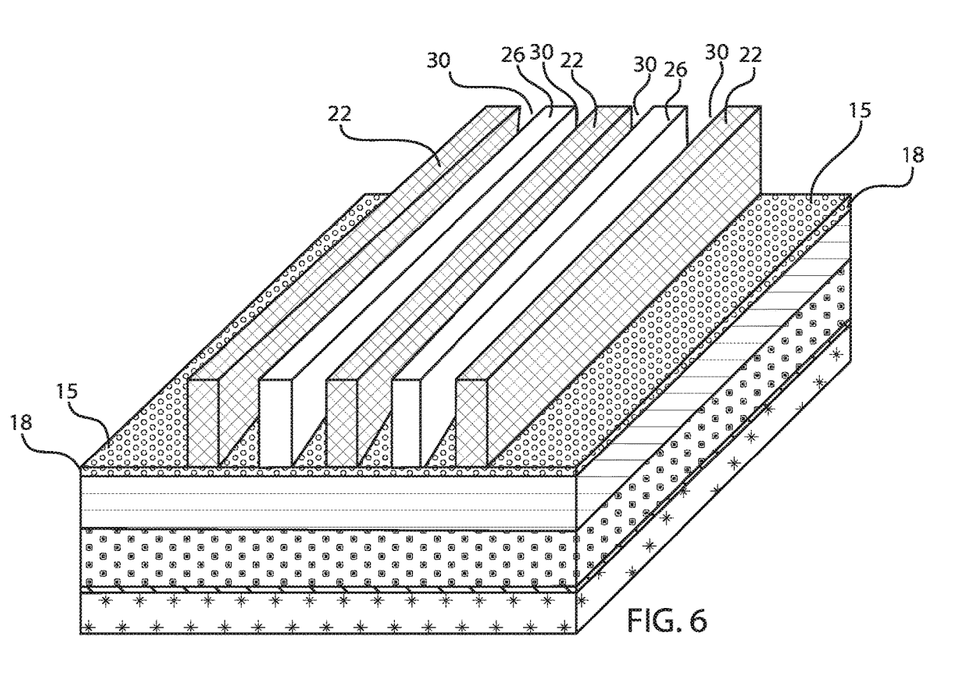
FIG. 6 is a perspective view of the semiconductor structure of FIG. 5 where the spacers are selectively removed, in accordance with an embodiment of the present invention.

FIG. 6 is a perspective view of the semiconductor structure of FIG. 5 where the spacers are selectively removed, in accordance with an embodiment of the present invention.

In various example embodiments, the spacers 24 are removed, thus allowing the mandrel portions 22 and the gap fill material sections 26 to remain. Gaps or openings 30 are formed between the mandrel portions 22 and the gap fill material sections 26. Openings 30 extend a length of the hardmask layer 18. The mandrel portions 22 are parallel to the gap fill material sections 26.

Etching of the spacers 24 includes an isotropic etch, and can include any appropriate etch chemistry. In some embodiments, the etch can include a wet etch with an etch solution including a phosphoric acid ($H_3PO_4$) etch or a dry etch such as chemical downstream etch with an etchant including $CH_3F$, $CH_2F_2$, and/or $CF_4$ in conjunction with $O_2$.

In general, regarding the etching of any materials, such materials can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide. The etch can, for example, include a wet etch such as a phosphoric acid ($H_3PO_4$) (wet chemistry) etch or a diluted hydrogen fluoride (HF) etch.

Figure 7:
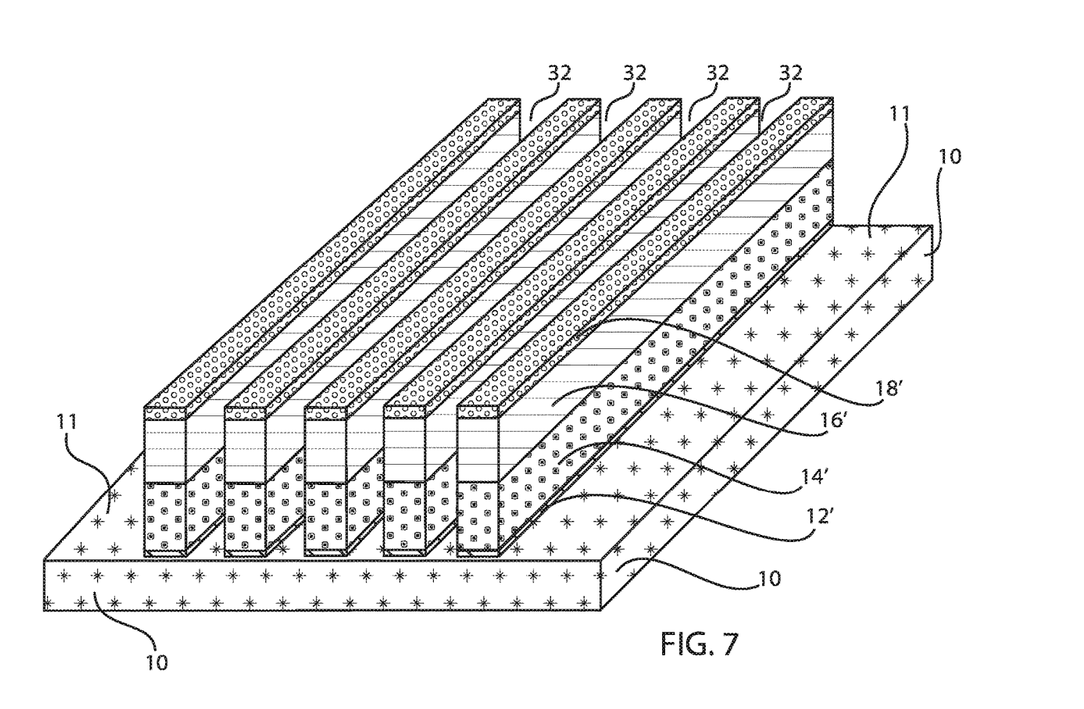
FIG. 7 is a perspective view of the semiconductor structure of FIG. 6 where the layers of the stack are etched to expose the top surface of the substrate, in accordance with an embodiment of the present invention.

FIG. 7 is a perspective view of the semiconductor structure of FIG. 6 where the layers of the stack are etched to expose the top surface of the substrate, in accordance with an embodiment of the present invention.

In various example embodiments, the hardmask layer 18, the dielectric layer 16, the conductive layer 14, and the metal liner 12 are etched to expose a top surface 11 of the substrate 10. In a preferred embodiment, the conductive layer 14 is a Ru layer. The partial removal of layers 18, 16, 14, 12 results in openings 32 extending a length of the top surface 11 of the substrate 10. The remaining stack includes metal liner portion 12', Ru layer portion 14', dielectric layer portion 16', and hardmask layer portion 18'. It is noted that the mandrel sections 22 and the gap fill material sections 26 are completely removed by the etching.

Figure 8:
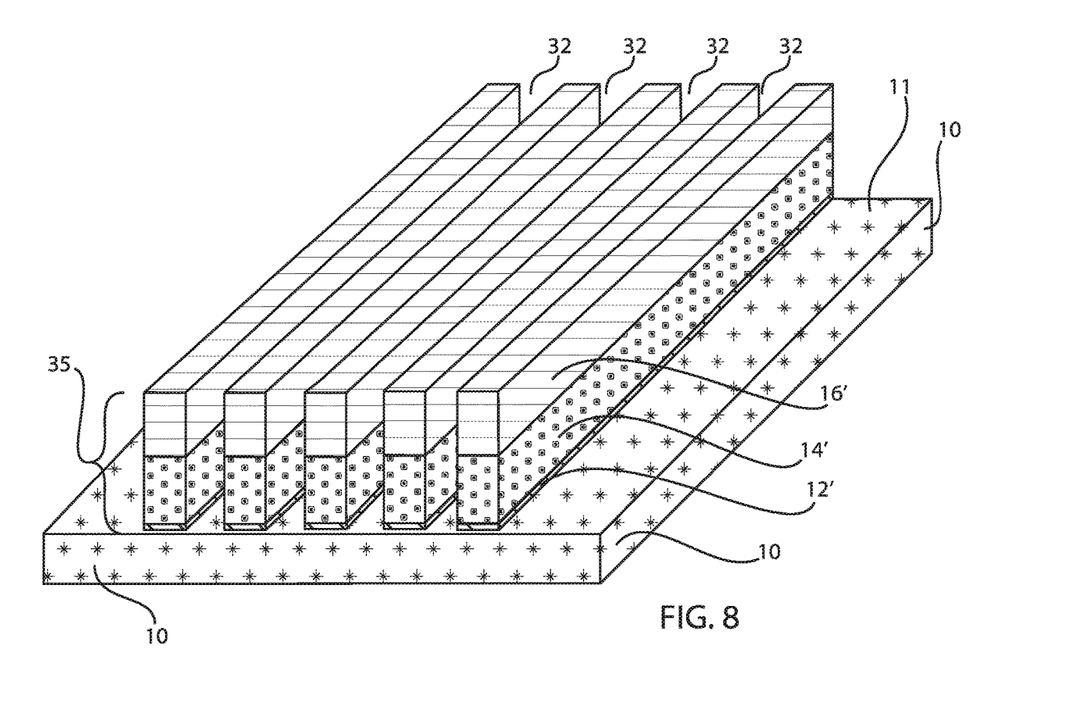
FIG. 8 is a perspective view of the semiconductor structure of FIG. 7 where the hardmask layer is selectively removed, in accordance with an embodiment of the present invention.

FIG. 8 is a perspective view of the semiconductor structure of FIG. 7 where the hardmask layer is selectively removed, in accordance with an embodiment of the present invention.

In various example embodiments, the hardmask layer portions 18' are removed to expose a top surface of dielectric layer portions 16'. This results in stacks 35 formed over the substrate 10. The stacks 35 each include metal liner portion 12', Ru layer portion 14', and dielectric layer portion 16'.

Figure 9:
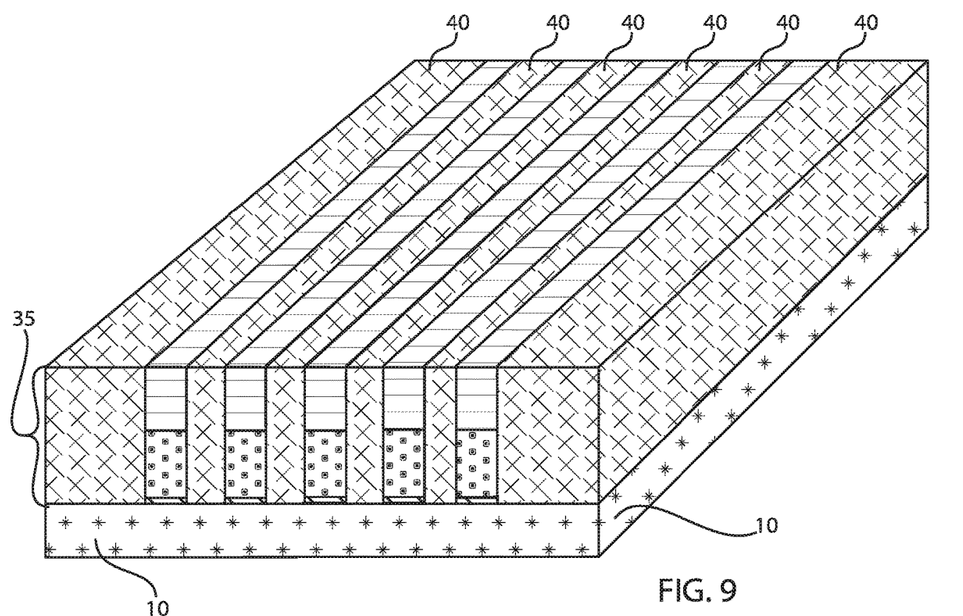
FIG. 9 is a perspective view of the semiconductor structure of FIG. 8 where a low-k dielectric is deposited and planarized, in accordance with an embodiment of the present invention.

FIG. 9 is a perspective view of the semiconductor structure of FIG. 8 where a low-k dielectric is deposited and planarized, in accordance with an embodiment of the present invention.

In various example embodiments, an interlayer dielectric (ILD) 40 is deposited and planarized. The ILD 40 is planarized such that a top surface of the ILD is flush or level with the top surface of the dielectric layer portions 16'.

The ILD 40 can include any materials known in the art, such as, for example, porous silicates, carbon doped oxides, silicon dioxides, silicon nitrides, silicon oxynitrides, or other dielectric materials. The ILD 40 can be formed using any method known in the art, such as, for example, chemical vapor deposition, plasma enhanced chemical vapor deposition, atomic layer deposition, or physical vapor deposition. The ILD 40 can have a thickness ranging from about 25 nm to about 200 nm.

The dielectric material of layer 40 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

One example of a material suitable for the low-k materials for the low-k dielectric layer 40 can include silicon oxycarbonitride (SiOCN). Other low-k materials that can also be used for the low-k material layer 40 can include fluorine doped silicon dioxide, carbon doped silicon dioxide, porous silicon dioxide, porous carbon doped silicon dioxide, organosilicate glass (OSG), diamond-like carbon (DLC) and combinations thereof.

Figure 10:
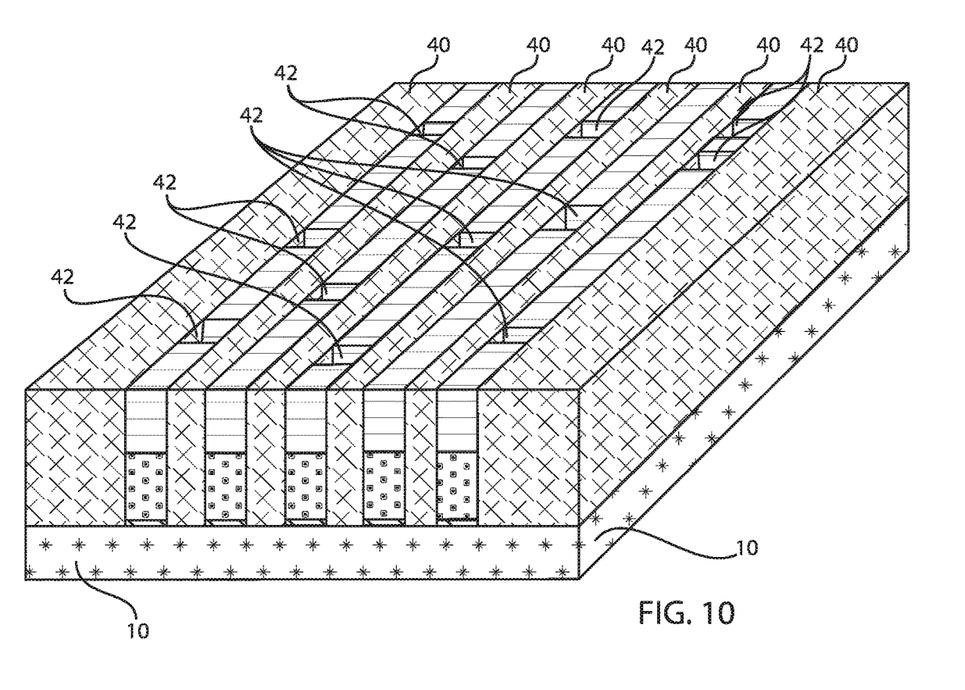
FIG. 10 is a perspective view of the semiconductor structure of FIG. 9 where openings are formed to top surfaces of the Ru layer, in accordance with an embodiment of the present invention.

FIG. 10 is a perspective view of the semiconductor structure of FIG. 9 where openings are formed to top surfaces of the Ru layer, in accordance with an embodiment of the present invention.

In various example embodiments, vias 42 are formed in dielectric layer portions 16'. The vias 42 extend to a top surface of the Ru layer portions 14'. Thus, via etching is conducted through the dielectric mask and terminates on the conductive material. Selective via etching allows vias confined only in the dielectric mask and thus self-aligned vias are formed.

Figure 11:
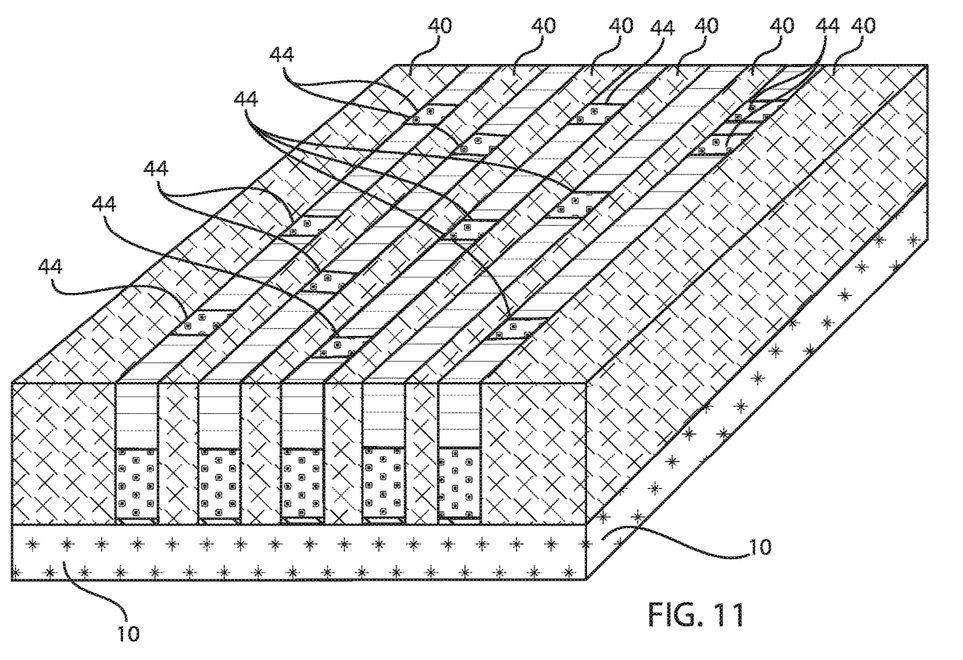
FIG. 11 is a perspective view of the semiconductor structure of FIG. 10 where the openings are filled with a conductive material to define metal vias, in accordance with an embodiment of the present invention.

FIG. 11 is a perspective view of the semiconductor structure of FIG. 10 where the openings are filled with a conductive material to define metal vias, in accordance with an embodiment of the present invention.

In various example embodiments, vias 42 are filled with a conductive material 44. The conductive material 44 can be, e.g., Ru. Therefore, the conductive layer 14' can be Ru and the via fill 44 can be Ru. The conductive material 44 can be planarized to be flush or level with a top surface of the dielectric layer portions 16'. The via fills 44 can be referred to as Ru pillars.

Figure 12:
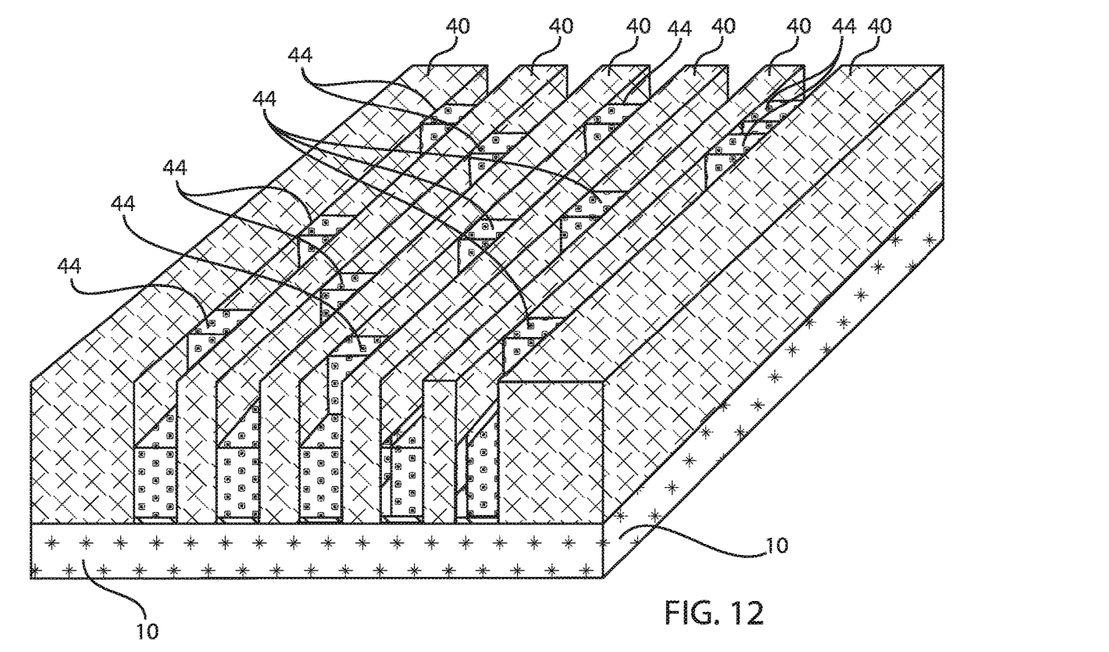
FIG. 12 is a perspective view of the semiconductor structure of FIG. 11 where the dielectric material is removed to expose sidewalls of the conductive material and top surfaces of the Ru layer, in accordance with an embodiment of the present invention.

FIG. 12 is a perspective view of the semiconductor structure of FIG. 11 where the dielectric material is removed to expose sidewalls of the conductive material and top surfaces of the Ru layer, in accordance with an embodiment of the present invention.

In various example embodiments, the dielectric layer portions 16' are removed thus exposing the sidewalls of metal vias or pillars 44 and further exposing top surfaces of the conductive material layers 14'. As a result, the conductive material layers 14' with the metal vias or pillars 44 can form substantially inverted T-shaped configurations.

As a result, Ru can be used instead of Cu for BEOL metallization levels. The conductive layer 14' can be considered the M1 metallization level and the via fill 44 can be considered the M2 metallization level.

Figure 13:
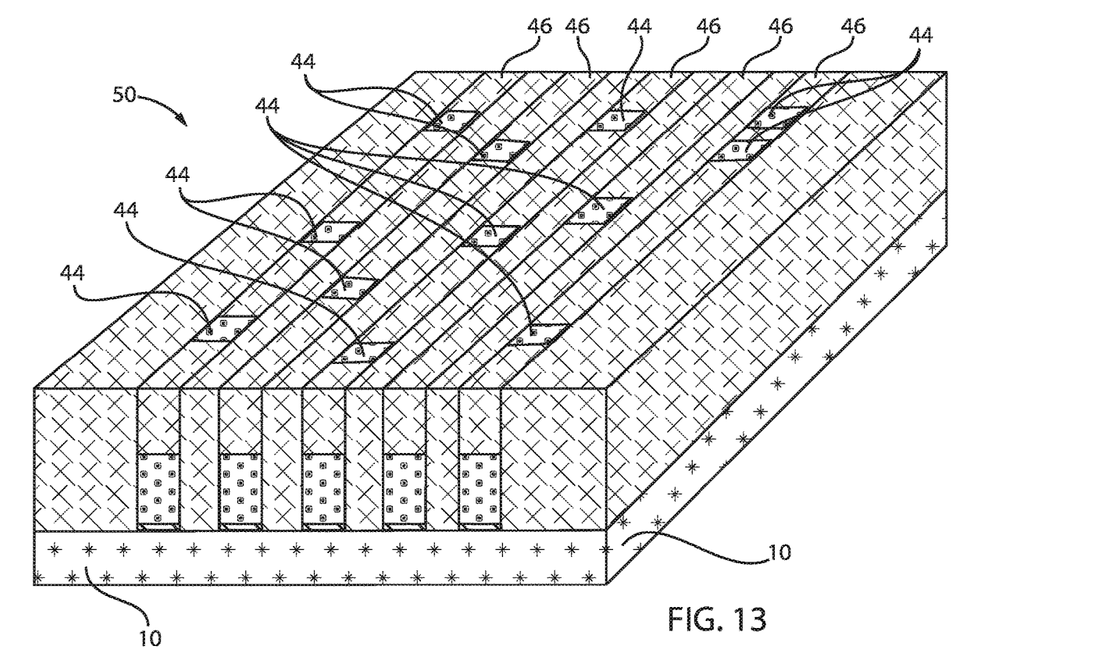
FIG. 13 is a perspective view of the semiconductor structure of FIG. 12 where a low-k dielectric is deposited and planarized such that a top surface of the metal vias is exposed, in accordance with an embodiment of the present invention.

FIG. 13 is a perspective view of the semiconductor structure of FIG. 12 where a low-k dielectric is deposited and planarized such that a top surface of the metal vias is exposed, in accordance with an embodiment of the present invention.

A low-k dielectric 46 is deposited and planarized such that a top surface of the metal vias 44 is exposed to create structure 50.

Regarding the ruthenium employed in FIGS. 1-13, ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means Ru will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals. Ruthenium plating is also used when manufacturing semiconductors.

Ruthenium has drawn substantial interest because Ru can serve as both barrier and seed layers, minimizing the amount of high resistance material needed in semiconductor circuits. As linewidths shrink below 15 nm, though, even a 1 or 2 nanometer barrier layer can be too much. As line volume shrinks, the resistance of copper (Cu) rises sharply due to electron scattering from sidewalls and grain boundaries. Increasing resistance adds to overall circuit delays and also contributes to electromigration. As a refractory metal, ruthenium has a very high melting point (above 2300° C.) and good electromigration resistance. Therefore, the use of ruthenium provides advantageous unexpected results, as the stripping of the TiN layer does not affect (e.g., etch) the ruthenium layer during processing.

In summary, the exemplary embodiments allow for a metal (e.g., Ru) and via height to be predetermined. The via is fully aligned to the underlying metal line. Further, no erosion of the via during the metal etching occurs, thus making the via height consistent with a substantially flat top surface. As a result, BEOL metallization with lines formed by subtractive patterning and vias formed by damascene processes can be achieved. Vias are fully aligned to underlying metal lines, and uniform metal lines and via height are achieved.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for methods and devices for achieving back-end-of-the-line (BEOL) metallization with lines formed by subtractive patterning and vias formed by damascene processes (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for back-end-of-the-line (BEOL) metallization with lines formed by subtractive patterning and vias formed by damascene processes, the method comprising:
   depositing a dielectric layer over a conductive layer formed over a substrate;
   forming spacers surrounding mandrel sections formed over the dielectric layer;
   depositing gap fill material adjacent the spacers;
   selectively removing the spacers;
   etching the dielectric layer and the conductive layer to expose a top surface of the substrate and to define stacks on the substrate;
   depositing an inter-layer dielectric over and between the stacks;
   planarizing the inter-layer dielectric to a top surface of the stacks;
   selectively forming openings in the dielectric layer; and
   filling the openings with a conductive material to define metal vias.

2. The method of claim 1, wherein the conductive layer includes ruthenium (Ru).

3. The method of claim 1, wherein the conductive material filling the openings includes Ru.

4. The method of claim 1, wherein a hardmask layer is formed between the dielectric layer and the mandrel sections.

5. The method of claim 4, wherein the mandrel sections are parallel to the spacers.

6. The method of claim 1, wherein the openings in the dielectric layer extend to a top surface of the conductive layer.

7. The method of claim 1, wherein a height of the conductive layer and a height of the dielectric layer are predetermined.

8. The method of claim 7, wherein the height of the dielectric layer corresponds to a height of the metal vias.

9. The method of claim 8, wherein the metal vias are fully aligned with underlying metal lines formed from the conductive layer.

10. The method of claim 1, wherein the metal vias directly contact a top surface of the metal lines formed from the conductive layer.

11. A method for back-end-of-the-line (BEOL) metallization with lines formed by subtractive patterning and vias formed by damascene processes, the method comprising:
    forming a dielectric layer over a conductive layer formed over a substrate;
    etching the dielectric layer and the conductive layer to define a first metallization level as well as stacks over the substrate;
    depositing an inter-layer dielectric over and between the stacks;
    selectively forming openings through the dielectric layer; and
    filling the openings with a conductive material to define metal vias in a second metallization level, at least some of the metal vias being horizontally offset with respect to an axis extending parallel to the substrate,
    wherein a width of the metal vias is equal to a width of the stacks.

12. The method of claim 11, wherein the conductive material filling the openings includes Ru.

13. The method of claim 11, wherein a hardmask layer and mandrel sections are formed over the dielectric layer before etching of the dielectric layer and the conductive layer.

14. The method of claim 13, wherein spacers are formed adjacent the mandrel sections after the hardmask layer and the mandrel sections are formed.

15. The method of claim 14, wherein the mandrel sections are parallel to the spacers.

16. The method of claim 11, wherein a height of the conductive layer and a height of the dielectric layer are predetermined.

17. The method of claim 16, wherein the height of the dielectric layer corresponds to a height of the metal vias.

18. The method of claim 17, wherein the metal vias defining the second metallization level are fully aligned with the first metallization level.

* * * * *